US012683574B2

(12) United States Patent
Daimon

(10) Patent No.: US 12,683,574 B2
(45) Date of Patent: Jul. 14, 2026

(54) ACOUSTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 909 days.

(21) Appl. No.: 17/969,724

(22) Filed: Oct. 20, 2022

(65) Prior Publication Data

US 2023/0039830 A1    Feb. 9, 2023

Related U.S. Application Data

(63) Continuation of application No. PCT/JP2021/016055, filed on Apr. 20, 2021.

(30) Foreign Application Priority Data

Apr. 27, 2020    (JP) ................................. 2020-078146

(51) Int. Cl.
*H03H 9/02*        (2006.01)
*H03H 9/25*        (2006.01)

(52) U.S. Cl.
CPC .... *H03H 9/02818* (2013.01); *H03H 9/02559* (2013.01); *H03H 9/02637* (2013.01); *H03H 9/02866* (2013.01); *H03H 9/25* (2013.01)

(58) Field of Classification Search
CPC ........... H03H 9/02818; H03H 9/02559; H03H 9/02637; H03H 9/02866; H03H 9/25
USPC ...... 310/313 R, 313 A, 313 B, 313 C, 313 D
See application file for complete search history.

(56) References Cited

U.S. PATENT DOCUMENTS

| | | | |
|---|---|---|---|
| 2008/0061657 A1* | 3/2008 | Matsuda | H03H 9/0038 |
| | | | 333/186 |
| 2013/0051588 A1 | 2/2013 | Ruile et al. | |
| 2016/0359468 A1* | 12/2016 | Taniguchi | H03H 9/02921 |
| 2016/0380611 A1* | 12/2016 | Kai | H03H 9/02984 |
| | | | 310/313 B |
| 2017/0155373 A1 | 6/2017 | Ruby et al. | |
| 2019/0123713 A1 | 4/2019 | Daimon | |
| 2019/0149128 A1 | 5/2019 | Saji et al. | |

(Continued)

FOREIGN PATENT DOCUMENTS

| | | |
|---|---|---|
| CN | 101145767 A | 3/2008 |
| CN | 109698681 A | 4/2019 |
| JP | 2008067289 A | 3/2008 |

(Continued)

OTHER PUBLICATIONS

Request for the Submission of an Opinion in KR10-2022-7033335, mailed May 12, 2024, 5 pages.

(Continued)

*Primary Examiner* — Derek J Rosenau
(74) *Attorney, Agent, or Firm* — Keating & Bennett, LLP

(57)        ABSTRACT

An acoustic wave device includes an IDT electrode on a piezoelectric substrate and reflector electrodes on both sides of the IDT electrode in an acoustic wave propagation direction and each including electrode fingers with gaps therebetween, and first dielectric films between the reflector electrodes and the piezoelectric substrate in regions where the electrode fingers and the gaps of the reflector electrodes are provided.

20 Claims, 5 Drawing Sheets

(56)     References Cited

U.S. PATENT DOCUMENTS

| | | | |
|---|---|---|---|
| 2019/0260349 A1 | 8/2019 | Takai et al. | |
| 2020/0195219 A1 | 6/2020 | Yamamoto et al. | |

FOREIGN PATENT DOCUMENTS

| | | | |
|---|---|---|---|
| JP | 2013518455 A | 5/2013 |
| JP | 2015167272 A | 9/2015 |
| KR | 1020190056293 A | 5/2019 |
| KR | 20190099118 A | 8/2019 |
| WO | 2015151706 A1 | 10/2015 |
| WO | 2019044203 A1 | 3/2019 |

OTHER PUBLICATIONS

International Search Report in PCT/JP2021/016055, mailed May 25, 2021, 3 pages.

Written Opinion in PCT/JP2021/016055, mailed May 25, 2021, 4 pages.

Official Communication issued in corresponding Chinese Patent Application No. 202180029320.8, mailed on May 17, 2025, 6 pages.

\* cited by examiner

ACOUSTIC WAVE DEVICE

CROSS REFERENCE TO RELATED APPLICATIONS

This application claims the benefit of priority to Japanese Patent Application No. 2020-078146 filed on Apr. 27, 2020 and is a Continuation Application of PCT Application No. PCT/JP2021/016055 filed on Apr. 20, 2021. The entire contents of each application are hereby incorporated herein by reference.

BACKGROUND OF THE INVENTION

1. Field of the Invention

The present invention relates to an acoustic wave device including an IDT electrode and reflector electrodes.

2. Description of the Related Art

In an acoustic wave device disclosed in US 2017/0155373 A1, a piezoelectric film is stacked on a support substrate. An IDT electrode and reflector electrodes disposed on both sides of the IDT electrode in the acoustic wave propagation direction are provided on the piezoelectric film. In US 2017/0155373 A1, a crossing region of the IDT electrode includes a center region and first and second edge regions disposed outside the center region in the direction in which the electrode fingers extend. In the first and second edge regions, a dielectric film is provided between the electrode fingers and the piezoelectric film.

In the invention disclosed in US 2017/0155373 A1, although resonance characteristics can be obtained using SH waves, there is an issue in that the response due to Rayleigh waves is large, and therefore a spurious response due to Rayleigh waves is large.

SUMMARY OF THE INVENTION

Preferred embodiments of the present invention provide acoustic wave devices in each of which a response due to Rayleigh waves is reduced or prevented.

An acoustic wave device according to a preferred embodiment of the present invention includes a piezoelectric substrate, an IDT electrode on the piezoelectric substrate, and reflector electrodes on both sides of the IDT electrode in an acoustic wave propagation direction and including a plurality of electrode fingers with gaps therebetween. The acoustic wave device further includes a first dielectric film between the reflector electrodes and the piezoelectric substrate in regions where the plurality of electrode fingers and the gaps of the reflector electrodes are provided.

An acoustic wave device according to a preferred embodiment of the present invention includes a piezoelectric substrate, an IDT electrode on the piezoelectric substrate, and reflector electrodes on both sides of the IDT electrode in an acoustic wave propagation direction and including a plurality of electrode fingers with gaps therebetween. The acoustic wave device further includes a first dielectric film between the plurality of electrode fingers of the reflector electrodes and the piezoelectric substrate and not provided in any portion of a region between the piezoelectric substrate and regions where the gaps of the reflector electrodes are provided.

According to preferred embodiments of the present invention, acoustic wave devices in each of which a response due to Rayleigh waves is reduced or prevented can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
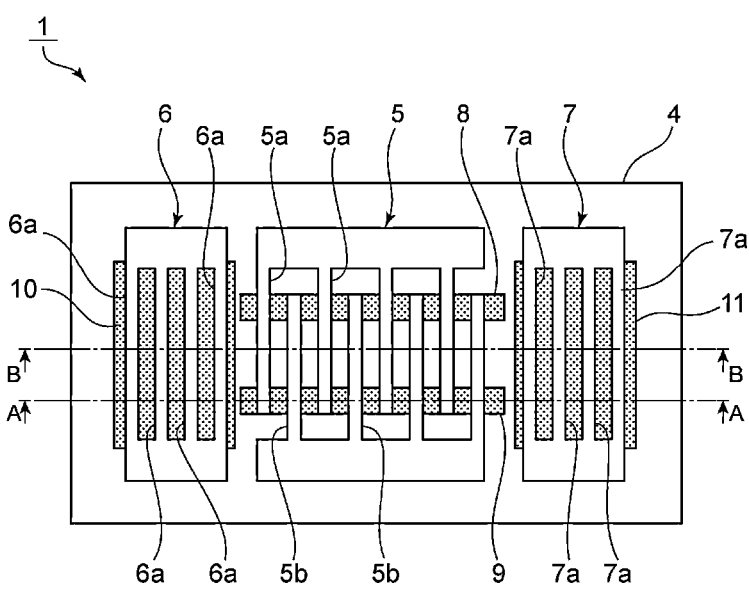
FIG. 1 is a plan view of an acoustic wave device according to a first preferred embodiment of the present invention.

Hereafter, the present invention will be made clearer by describing preferred embodiments of the present invention while referring to the drawings.

The preferred embodiments described in the present specification are illustrative examples and portions of the configurations illustrated in different preferred embodiments can be substituted for one another or combined with one another.

Figure 2A:
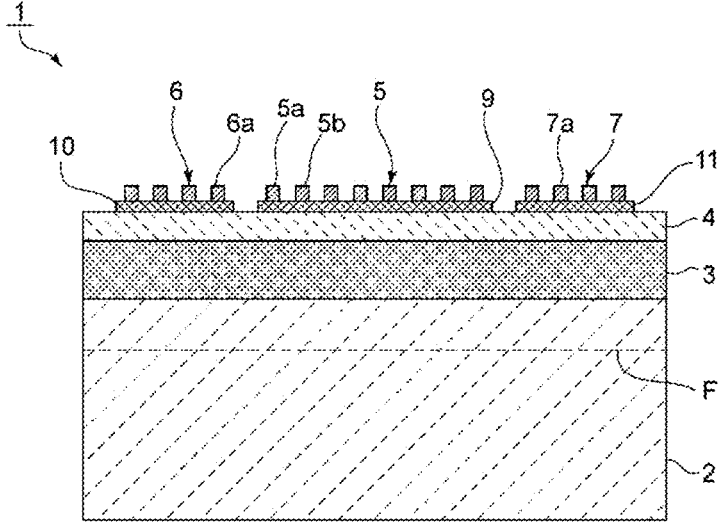
FIGS. 2A and 2B are sectional views taken along line A-A and line B-B in FIG. 1, respectively.
Figure 2B:
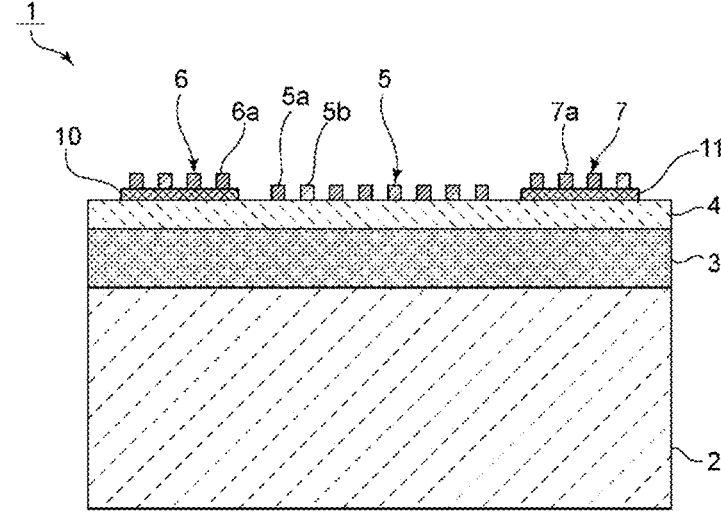

FIG. 1 is a plan view of an acoustic wave device according to a first preferred embodiment of the present invention and FIGS. 2A and 2B are sectional views taken along lines A-A and B-B in FIG. 1.

An acoustic wave device 1 according to the first preferred embodiment includes a support substrate 2. The support substrate 2 is made of Si, for example. A silicon oxide film 3, for example, is provided on the support substrate 2 as a low acoustic velocity film. A piezoelectric film 4 made of, for example, LiTaO$_3$ is provided on the silicon oxide film 3. In other words, a piezoelectric substrate includes the support substrate 2, the silicon oxide film 3, and the piezoelectric film 4 that are stacked on top of one another. The piezoelectric material of the piezoelectric film 4 is not limited to LiTaO$_3$, and, for example, LiNbO$_3$ or the like may be used. In the present preferred embodiment, for example, Y-cut LiTaO$_3$ is used.

An interdigital transducer (IDT) electrode 5 is provided on the piezoelectric film 4. The IDT electrode 5 includes a plurality of first electrode fingers 5a and a plurality of second electrode fingers 5b, which are interdigitated with each other.

The acoustic wave propagation direction is a direction that is perpendicular or substantially perpendicular to a direction in which the first and second electrode fingers 5a and 5b extend. Reflector electrodes 6 and 7 are disposed on both sides of the IDT electrode 5 in the acoustic wave propagation direction. The reflector electrodes 6 and 7 are structured so that both ends of electrode fingers 6a and 7a are short circuited.

The IDT electrode 5 and the reflector electrodes 6 and 7 are made of a metal such as, for example, Al, Mo, Cu, or W or an alloy mainly including of any of these metals. Furthermore, the IDT electrode 5 and the reflector electrodes 6 and 7 may include multilayer metal films provided by stacking a plurality of metal films.

In the IDT electrode 5, a region in which the first electrode fingers 5a and the second electrode fingers 5b overlap in the acoustic wave propagation direction is a crossing region. The crossing region includes a center region located in the center in the direction in which the first and second electrode fingers 5a and 5b extend and first and second edge regions provided on both sides of the center region in the direction in which the first and second electrode fingers 5a and 5b extend. Dielectric films 8 and 9 defining and functioning as second dielectric films are provided in the first and second edge regions. The second dielectric films 8 and 9 are provided between the IDT electrode 5 and the piezoelectric film 4. The dielectric films 8 and 9 are made of, for example, Ta$_2$O$_5$ films as tantalum oxide films in the present preferred embodiment. Providing the dielectric films 8 and 9 makes the acoustic velocity in the first and second edge regions lower than the acoustic velocity in the center region. This makes it possible to reduce or prevent transverse mode ripples.

A feature of the acoustic wave device 1 is that the reflector electrodes 6 and 7 are provided with dielectric films 10 and 11 as first dielectric films between the reflector electrodes 6 and 7 and the piezoelectric film 4.

The dielectric films 10 and 11 are made of, for example, Ta$_2$O$_5$ films as tantalum oxide films in the present preferred embodiment. The dielectric material of the dielectric films 10 and 11 is not limited to this material, and one oxide selected from a group consisting of, for example, niobium oxide such as Nb$_2$O$_3$, tungsten oxide such as WO$_3$, hafnium oxide such as Hf$_2$O$_5$, and cerium oxide such as CeO$_2$ may be suitably used.

In the acoustic wave device 1, a response due to Rayleigh waves can be reduced or prevented by providing the dielectric films 10 and 11. This will be described by illustrating the phase-frequency characteristics of Example 1 of a preferred embodiment of the present invention and Comparative Example 1.

As Example 1, the acoustic wave device 1 was fabricated with the following design parameters.

support substrate 2; Si silicon oxide film 3; about 600 nm thick SiO$_2$ film piezoelectric film 4; 50° Y-cut LiTaO$_3$, thickness=about 600 nm IDT electrode 5 and reflector electrodes 6 and 7; material AlCu, electrode thickness=about 140 nm wavelength λ determined by electrode finger pitch of IDT electrode 5=about 2 μm number of pairs of electrode fingers of IDT electrode 5=100 pairs dimension of crossing region=about 15λ dimension of first and second edge regions in direction in which first and second electrode fingers 5a and 5b extend=about 350 nm width of first and second electrode fingers 5a and 5b=about 500 nm number of electrode fingers 6a=40 number of electrode fingers 7a=40 width of electrode fingers 6a and 7a=about 500 nm dielectric films 8 and 9 composed of Ta$_2$O$_5$ films; thickness=about 30 nm Ta$_2$O$_5$ films serving as dielectric films 10 and 11; thickness=about 30 nm As illustrated in FIG. 1, the dielectric films 10 and 11 are disposed so as to be located not only below the electrode fingers 6a and 7a, but also in gap regions between the electrode fingers 6a and between the electrode fingers 7a in the reflector electrodes 6 and 7.

As Comparative Example 1, an acoustic wave device of Comparative Example 1 was constructed similarly to Example 1, except that the dielectric films 10 and 11 were not provided.

Figure 3:
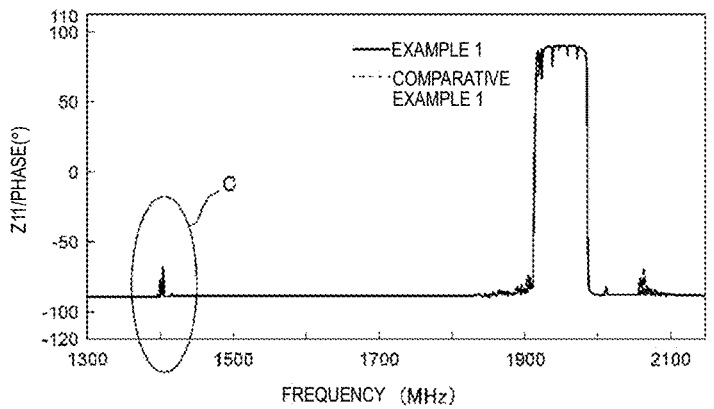
FIG. 3 is a diagram illustrating phase-frequency characteristics of acoustic wave devices of Example 1 of a preferred embodiment of the present and Comparative Example 1 of a preferred embodiment of the present invention.

In FIG. 3, the phase-frequency characteristic of Example 1 is illustrated with a solid line and the phase-frequency characteristic of Comparative Example 1 is illustrated with a broken line. In FIG. 3, the response of SH waves, which is the main mode used, appears in the vicinity of about 1900 MHz to about 1990 MHz. A response due to Rayleigh waves appears around 1400 MHz.

Figure 4:
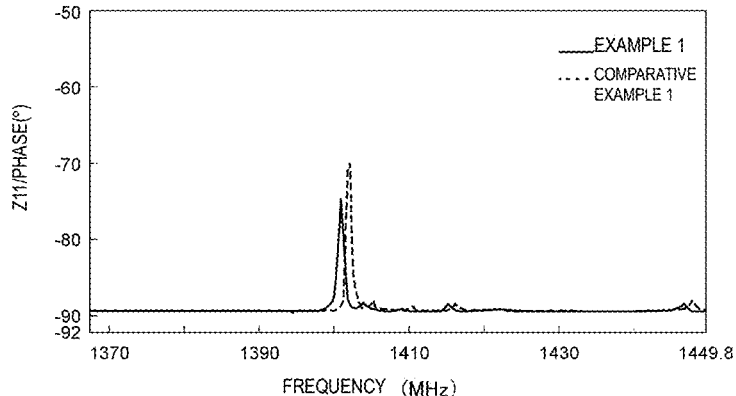
FIG. 4 is a diagram illustrating phase-frequency characteristics of Example 1 and Comparative Example 1 of a preferred embodiment of the present invention illustrating the area indicated by C in FIG. 3 in an enlarged manner.

FIG. 4 is a diagram illustrating the phase-frequency characteristics of Example 1 and Comparative Example 1 illustrating the area indicated by C in FIG. 3 in an enlarged manner. In FIG. 4 as well, the solid line represents the results of Example 1 and the broken line represents the results of Comparative Example 1. It is clear from FIG. 4 that the response due to Rayleigh waves can be reduced or prevented in Example 1 compared with Comparative Example 1. In other words, a spurious response due to Rayleigh waves can be effectively reduced or prevented in Example 1.

It is thought that the response due to Rayleigh waves can be reduced or prevented by providing the dielectric films 10 and 11 as described above due to the following reasons.

Rayleigh waves have a propagation direction component and a depth direction component. Providing the dielectric films 10 and 11 inhibits this propagation direction component and it becomes more difficult for Rayleigh waves to be excited. Therefore, it is thought that the response due to Rayleigh waves could be reduced or prevented.

Furthermore, in the present preferred embodiment, the dielectric films 10 and 11 are not disposed in the area where the IDT electrode 5 is provided. Therefore, capacitance is not reduced in the IDT electrode 5 and thus an increase in the size of the acoustic wave device can be avoided.

Figure 5:
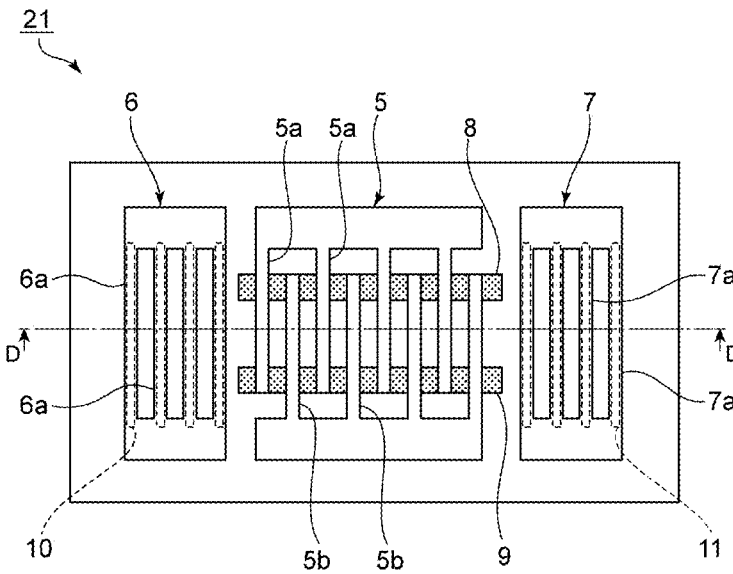
FIG. 5 is a plan view of an acoustic wave device according to a second preferred embodiment of the present invention.
Figure 6:
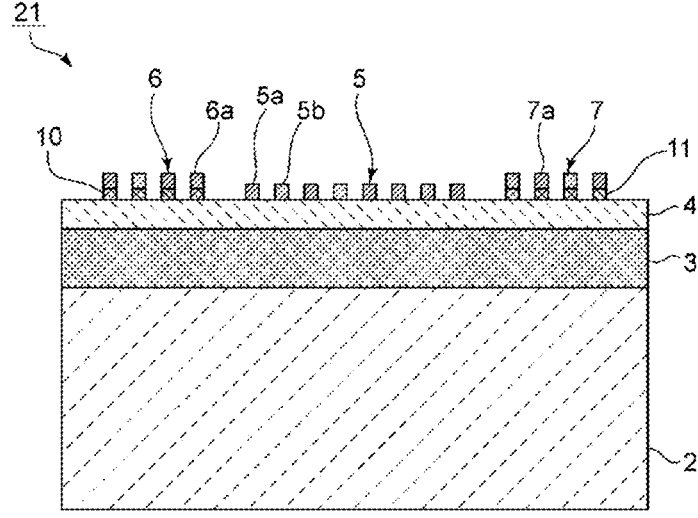
FIG. 6 is a sectional view taken along line D-D in FIG. 5.

FIG. 5 is a plan view of an acoustic wave device according to a second preferred embodiment of the present invention and FIG. 6 is a sectional view taken along line D-D in FIG. 5.

In an acoustic wave device 21, dielectric films 10 and 11 are provided below electrode fingers 6*a* of a reflector electrode 6 and below electrode fingers 7*a* of a reflector electrode 7, but are not provided in gap regions between the electrode fingers 6*a* or in gap regions between the electrode fingers 7*a*. In addition, the dielectric films 10 and 11 do not protrude beyond both sides of the reflector electrodes 6 and 7 in the acoustic wave propagation direction. In other words, the dielectric films 10 and 11 are only provided below the electrode fingers 6*a* and 7*a*. The remainder of the configuration of the acoustic wave device 21 is the same as or similar to that of the acoustic wave device 1. Therefore, the same portions are denoted by the same reference symbols and description thereof is omitted.

In a preferred embodiment of the present invention, the dielectric films 10 and 11 may be provided only between the piezoelectric film 4 and the electrode fingers 6*a* and 7*a* of the reflector electrodes 6 and 7 as in the acoustic wave device 21. In this case as well, a response due to Rayleigh waves can be effectively reduced or prevented. This will be explained by comparing and contrasting the phase-frequency characteristic of Example 2 of a preferred embodiment of the present invention and the phase-frequency characteristics of Example 1 and Comparative Example 1 described above.

An acoustic wave device of Example 2 was constructed so as to have the same or substantially the same configuration as Example 1, except that the dielectric films 10 and 11 were disposed only below the electrode fingers 6*a* and 7*a*.

Figure 7:
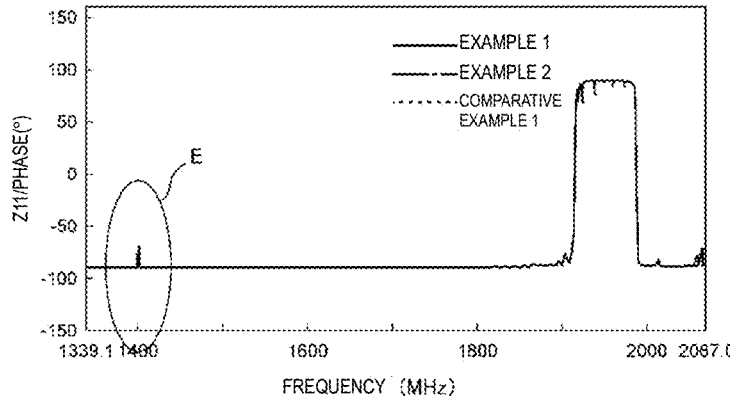
FIG. 7 is a diagram illustrating phase-frequency characteristics of acoustic wave devices of Example 1 of a preferred embodiment of the present invention, Example 2 of a preferred embodiment of the present invention, and Comparative Example 1.
Figure 8:
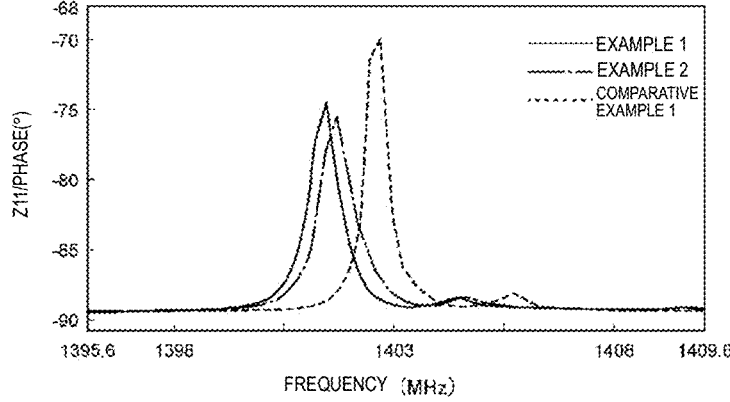
FIG. 8 is a diagram illustrating phase-frequency characteristics of Example 1 of a preferred embodiment of the present invention, Example 2 of a preferred embodiment of the present invention, and Comparative Example 1 illustrating the area indicated by E in FIG. 7 in an enlarged manner.

FIG. 7 is a diagram illustrating the phase-frequency characteristics of the acoustic wave devices of Example 1, Example 2, and Comparative Example 1. FIG. 8 illustrates the phase-frequency characteristics of Example 1, Example 2, and Comparative Example 1 with the area indicated by E in FIG. 7 illustrated in an enlarged manner.

In FIGS. 7 and 8, the results of Example 1 are illustrated with a solid line, the results of Example 2 are illustrated with a one-dot chain line, and the results of Comparative Example 1 are illustrated with a broken line.

Similarly to Example 1, it is clear from FIG. 8 that Rayleigh waves can also be effectively reduced or prevented in Example 2 compared with Comparative Example 1. Furthermore, in Example 2, the Rayleigh wave response can be reduced or prevented to a greater degree than in Example 1.

As described above, the response due to Rayleigh waves can be effectively reduced or prevented even in a case where the dielectric films 10 and 11 are only provided below the electrode fingers 6*a* and 7*a* of the reflector electrodes 6 and 7. In the present preferred embodiment, it is not necessary for the dielectric films 10 and 11 to be provided in the area where the IDT electrode 5 is disposed. Therefore, capacitance is not reduced and thus an increase in the size of the acoustic wave device 21 can be avoided.

In addition, in the acoustic wave device 21 according to the second preferred embodiment, the dielectric films 10 and 11 are not provided in the gap regions of the reflector electrodes 6 and 7. Therefore, the reflection coefficient is sufficiently ensured, and consequently the response due to Rayleigh waves can be further reduced or prevented.

In the first and second preferred embodiments, the dielectric films 10 and 11 are made of $Ta_2O_5$, for example, but other oxide dielectrics may be used as described above.

Figure 9:
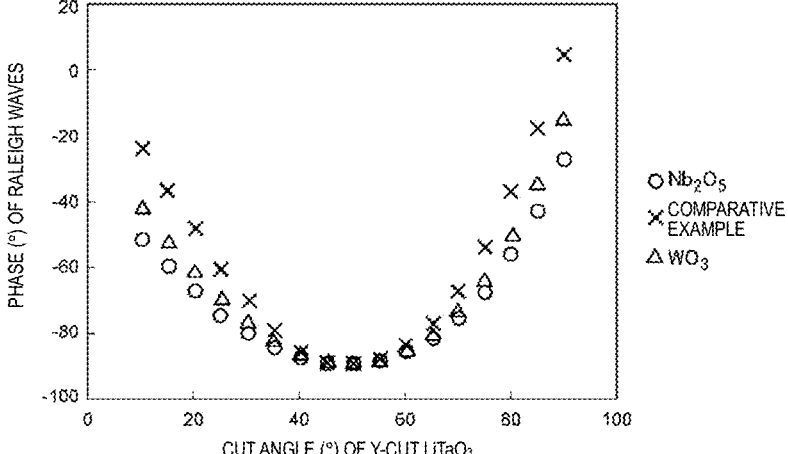
FIG. 9 is a diagram illustrating the relationship between the cut angle of Y-cut LiTaO$_3$ and the magnitude of the phase of Rayleigh waves for acoustic wave devices of a comparative example and examples of a preferred embodiment of the present invention in which niobium oxide and tungsten oxide are used as a dielectric film.

FIG. 9 illustrates the relationship between the cut angle of Y-cut $LiTaO_3$ and the magnitude of the phase of Rayleigh waves when the dielectric films 10 and 11 are made of, for example, $Nb_2O_5$ as niobium oxide and $WO_3$ as tungsten oxide. In FIG. 9, ○ indicates the results for the case where $Nb_2O_5$ was used and Δ indicates the results for the case where $WO_3$ was used. In addition, x indicates the results of above-described Comparative Example 1 in FIG. 9.

Each acoustic wave device was constructed in the same or substantially the same manner as Example 1, except for the materials of the oxide dielectrics being changed and the cut angle being changed.

It is clear from FIG. 9 that the phase of Rayleigh waves can be reduced compared to Comparative Example 1 by providing the dielectric films 10 and 11 made of $Nb_2O_5$ or $WO_3$ in all cases where the cut angle of $LiTaO_3$ is from about 10° to about 90°, for example. In particular, when the cut angle is less than or equal to about 40° or greater than or equal to about 60°, for example, the Rayleigh wave response can be more effectively reduced or prevented compared to Comparative Example 1.

As illustrated in FIGS. 2A and 2B, for example, in the acoustic wave device 1, a piezoelectric substrate is used in which a low acoustic velocity film made of the silicon oxide film 3 and the piezoelectric film 4 are stacked on the support substrate 2 made of Si. In this case, the term "low acoustic velocity film" refers to a film composed of a low acoustic velocity material in which the acoustic velocity of a bulk wave propagating therein is lower than the acoustic velocity of a bulk wave propagating in the piezoelectric film 4. For example, a material mainly including a compound obtained by adding fluorine, carbon, or boron to silicon oxide, glass, silicon oxynitride, tantalum oxide, or silicon oxide can be used as the low acoustic velocity material.

Furthermore, although the support substrate 2 is made of Si, the support substrate 2 may be made of, for example, any of various high acoustic velocity materials including Si. In other words, it is acceptable for a high acoustic velocity material layer to be integrated with a support substrate. "High acoustic velocity material" refers to a material in which the acoustic velocity of a propagating bulk wave is higher than the acoustic velocity of an acoustic wave propagating in the piezoelectric film 4, and various materials such as a medium mainly including, for example, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a diamond-like carbon (DLC) film, or diamond, or a medium mainly including a mixture of any of these materials can be used as the high acoustic velocity material.

Furthermore, a high acoustic velocity material layer made of a high acoustic velocity material may be disposed between a position indicated by a broken line F in FIG. 2A and the silicon oxide film 3. In this case, for example, an insulator or a semiconductor other than a high acoustic velocity material may be used as the support substrate 2.

Figure 10:
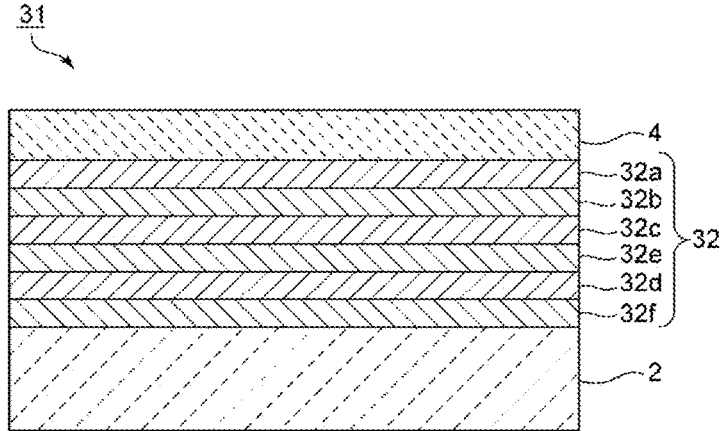
FIG. 10 is a front sectional view illustrating a piezoelectric substrate of a modification of a preferred embodiment of the present invention.

Furthermore, in the acoustic wave device 1, a piezoelectric substrate illustrated in FIG. 10 may be used. In a piezoelectric substrate 31, an acoustic reflective film 32 is disposed between the support substrate 2 and the piezoelectric film 4. The acoustic reflective film 32 includes low acoustic impedance layers 32*a*, 32*c*, and 32*e*, which have relatively low acoustic impedances, and high acoustic impedance layers 32*b*, 32*d*, and 32*f*, which have relatively high acoustic impedances. The number of stacked low acoustic impedance layers and the number of high acoustic impedance layers are not particularly limited.

Figure 11:
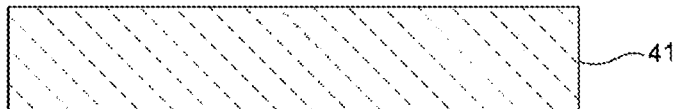
FIG. 11 is a front sectional view for describing a modification of a piezoelectric substrate according to a preferred embodiment of the present invention.

In addition, in a preferred embodiment of the present invention, a piezoelectric substrate 41 illustrated in FIG. 11 may be used. The piezoelectric substrate 41 include only a piezoelectric material. For example, $LiTaO_3$ or $LiNbO_3$ may be used as the piezoelectric material.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric substrate;
   an interdigital transducer (IDT) electrode on the piezoelectric substrate;
   reflector electrodes on both sides of the IDT electrode in an acoustic wave propagation direction and including a plurality of electrode fingers with gaps therebetween; and
   a first dielectric film between the reflector electrodes and the piezoelectric substrate in regions where the plurality of electrode fingers and the gaps of the reflector electrodes are provided; wherein
   the first dielectric film is not provided between at least a portion of the IDT electrode and the piezoelectric substrate.

2. The acoustic wave device according to claim 1, wherein
   the IDT electrode includes a plurality of first electrode fingers and a plurality of second electrode fingers that interdigitate with each other;
   a region where the first electrode fingers and the second electrode fingers overlap in the acoustic wave propagation direction is a crossing region;
   the crossing region includes a center region and first and second edge regions on both sides of the center region in a direction in which the first and second electrode fingers extend; and
   a second dielectric film is provided between the IDT electrode and the piezoelectric substrate in the first and second edge regions.

3. The acoustic wave device according to claim 1, wherein the first dielectric film is made of tantalum oxide, niobium oxide, tungsten oxide, hafnium oxide, or cerium oxide.

4. The acoustic wave device according to claim 1, wherein the piezoelectric substrate is made of a piezoelectric material including $LiNbO_3$ or $LiTaO_3$.

5. The acoustic wave device according to claim 1, wherein
   the piezoelectric substrate includes a support substrate and a piezoelectric film directly or indirectly stacked on the support substrate; and
   the piezoelectric film is made of $LiNbO_3$ or $LiTaO_3$.

6. The acoustic wave device according to claim 5, wherein the piezoelectric substrate further includes a high acoustic velocity material layer between the piezoelectric film and the support substrate and made of a high acoustic velocity material in which an acoustic velocity of a bulk wave propagating therein is higher than an acoustic velocity of an acoustic wave propagating in the piezoelectric film.

7. The acoustic wave device according to claim 6, further comprising a low acoustic velocity film between the high acoustic velocity material layer and the piezoelectric film, and made of a low acoustic velocity material in which an acoustic velocity of a bulk wave propagating therein is lower than an acoustic velocity of a bulk wave propagating in the piezoelectric film.

8. The acoustic wave device according to claim 6, wherein the high acoustic velocity material layer is integrated with the support substrate.

9. The acoustic wave device according to claim 5, wherein the piezoelectric substrate further includes an acoustic reflective film between the piezoelectric film and the support substrate.

10. The acoustic wave device according to claim 9, wherein the acoustic reflective film includes a low acoustic impedance layer having a relatively low acoustic impedance and a high acoustic impedance layer having a relatively high acoustic impedance.

11. An acoustic wave device comprising:
    a piezoelectric substrate;
    an interdigital transducer (IDT) electrode on the piezoelectric substrate;
    reflector electrodes on both sides of the IDT electrode in an acoustic wave propagation direction and including a plurality of electrode fingers with gaps therebetween; and
    a first dielectric film between the plurality of electrode fingers of the reflector electrodes and the piezoelectric substrate and not provided in any portion of a region between the piezoelectric substrate and regions where the gaps of the reflector electrodes are provided.

12. The acoustic wave device according to claim 11, wherein
    the IDT electrode includes a plurality of first electrode fingers and a plurality of second electrode fingers that interdigitate with each other;
    a region where the first electrode fingers and the second electrode fingers overlap in the acoustic wave propagation direction is a crossing region;
    the crossing region includes a center region and first and second edge regions on both sides of the center region in a direction in which the first and second electrode fingers extend; and
    a second dielectric film is provided between the IDT electrode and the piezoelectric substrate in the first and second edge regions.

13. The acoustic wave device according to claim 11, wherein the first dielectric film is made of tantalum oxide, niobium oxide, tungsten oxide, hafnium oxide, or cerium oxide.

14. The acoustic wave device according to claim 11, wherein the piezoelectric substrate is made of a piezoelectric material including $LiNbO_3$ or $LiTaO_3$.

15. The acoustic wave device according to claim 11, wherein
    the piezoelectric substrate includes a support substrate and a piezoelectric film directly or indirectly stacked on the support substrate; and
    the piezoelectric film is made of $LiNbO_3$ or $LiTaO_3$.

16. The acoustic wave device according to claim 15, wherein the piezoelectric substrate further includes a high acoustic velocity material layer between the piezoelectric film and the support substrate and made of a high acoustic velocity material in which an acoustic velocity of a bulk wave propagating therein is higher than an acoustic velocity of an acoustic wave propagating in the piezoelectric film.

17. The acoustic wave device according to claim 16, further comprising a low acoustic velocity film between the high acoustic velocity material layer and the piezoelectric film, and made of a low acoustic velocity material in which an acoustic velocity of a bulk wave propagating therein is lower than an acoustic velocity of a bulk wave propagating in the piezoelectric film.

18. The acoustic wave device according to claim 16, wherein the high acoustic velocity material layer is integrated with the support substrate.

19. The acoustic wave device according to claim 15, wherein the piezoelectric substrate further includes an acoustic reflective film between the piezoelectric film and the support substrate.

20. The acoustic wave device according to claim 19, wherein the acoustic reflective film includes a low acoustic impedance layer having a relatively low acoustic impedance and a high acoustic impedance layer having a relatively high acoustic impedance.

\* \* \* \* \*